United States Patent [19]

Seio et al.

[11] Patent Number: 4,952,481

[45] Date of Patent: Aug. 28, 1990

[54] PHOTOSENSITIVE RESIN COMPOSITION

[75] Inventors: Mamoru Seio, Nishinomiya; Hidefumi Kusuda, Takatsuki; Masami Kawabata, Suita, all of Japan

[73] Assignee: Napp Systems (USA), Inc., San Marcos, Calif.

[21] Appl. No.: 291,392

[22] Filed: Dec. 27, 1988

Related U.S. Application Data

[63] Continuation of Ser. No. 13,142, Feb. 11, 1987, abandoned, which is a continuation of Ser. No. 700,649, Feb. 12, 1985, abandoned.

[51] Int. Cl.$^5$ ............................................. G03C 1/70
[52] U.S. Cl. .................... 430/284; 430/287; 430/286; 522/115; 522/116; 522/118; 522/120; 522/102
[58] Field of Search .............. 430/286, 287, 284; 522/115, 116, 118, 120, 102

[56] References Cited

FOREIGN PATENT DOCUMENTS

| 0613952 | 2/1961 | Canada | 430/286 |
|---|---|---|---|
| 0090603 | 8/1976 | Japan | 430/286 |
| 0102230 | 6/1983 | Japan | 430/286 |

Primary Examiner—Paul R. Michl
Assistant Examiner—Cynthia Hamilton
Attorney, Agent, or Firm—Lyon & Lyon

[57] ABSTRACT

There is hereby provided a photosensitive resin composition suitable for a relief printing plate having an excellent resistance to a water based ink, whereby water or a water like solvent can be employed as a developing solution, which comprises;

(i) a polymer (A) having a molecular weight of 5,000 to 500,000 which contains an amino group and a polymerizable double bond moiety, (ii) a monomer (B) having an $\alpha,\beta$-ethylenically unsaturated bond and a free acid group which can quaternize the nitrogen atom of the polymer (A), (iii) a photopolymerizable unsaturated compound (C), and (iv) a photopolymerization initiator (D).

7 Claims, No Drawings

PHOTOSENSITIVE RESIN COMPOSITION

This is a continuation of co-pending application Ser. No. 013,142 filed on Feb. 11, 1987, now abandoned, which is a continuation of co-pending application Ser. No. 700,649, filed on Feb. 12, 1985, now abandoned.

FIELD OF THE INVENTION:

The present invention relates to a photosensitive resin composition, more particularly, a photosensitive resin composition suitable for a relief printing plate having an excellent resistance to water based and oil based ink, whereby water or an aqueous solvent can be employed as a developing solution.

The photosensitive resin composition of the present invention is suitable not only for the relief printing plate, but also for an offset printing plate, a screen and a resist.

BACKGROUND OF THE INVENTION;

There have been known photosensitive compositions for the relief printing plates comprising various type of base resins such as a liquid unsaturated polyester, polyvinyl alcohol, a water soluble polyamide, an alcohol-soluble polyamide, a styrene copolymer, 1,2-polybutadiene and the like. The composition based on the liquid unsaturated polyester is inconvenient for handling or treating because of its liquid form. In addition, there is a problem that the composition requires the use of an alkali solution or a specified air-knife for developing.

The composition based on the polyvinyl alcohol or the water soluble polyamide has the advantage that water can be employed in developing, but it has a demerit because a water base ink can not be employed in printing because of its poor water-resistance. The composition based on cellulose acetate succinate requires use of an alkali solution and it does not have a resistance to the aqueous ink. When the base resin is the alcohol-soluble polyamide, an inflammable alcohol has to be used for developing, which is a significant defect in environmental safety. The use of the styrene-isoprene-styrene block copolymer as the base resin requires (as a developing solvent) a halogenic organic solvent, which is also a defect in environmental safety for workers.

The object of the present invention provides a photosensitive resin composition especially suitable for a relief printing plate having an excellent resistance to water based ink, whereby water or an aqueous solvent can be employed as a developing solution.

SUMMARY OF THE INVENTION

The present invention provides a photosensitive resin composition which comprises;

(i) a polymer (A) having a molecular weight of 5,000 to 500,000 which contains an amino group and a polymerizable double bond moiety, (ii) a monomer (B) having an $\alpha,\beta$-ethylenically unsaturated bond and a free acid group which can quarternize the nitrogen atom of the polymer (A), (iii) a photopolymerizable unsaturated compound (C), and (iv) a photopolymerization initiator (D).

DETAILED DESCRIPTION OF THE PRESENT INVENTION

In the composition of the present invention, the polymer (A) is quaternized by the monomer (B) to become water-soluble or water-dispersible. This composition is formed into a sheet which is adhered onto a suitable substrate, such as steel, aluminum or plastics.

The photosensitive layer is exposed to an ultraviolet light through a negative film to copolymerize the polymer (A), the monomer (B) and the photopolymerizable unsaturated compound (C), which exposed part becomes water-insoluble. On the other hand, the unexposed part which has not been copolymerized can be dissolved and removed easily with water to complete the development of the relief plate.

Accordingly, the polymer (A) of the present invention contains the amino group atom in such an amount that the polymer becomes water-soluble or water-dispersible when the polymer is quaternized by the monomer (B). Also, the polymer (A) has the polymerizable double-bond moiety in such an amount that it can be copolymerized with the photopolymerizable unsaturated compound (C) to form a water-insoluble polymer, and, in addition, the polymer (A) has sufficient molecular weight to form a water-insoluble material. The double-bond moiety is not necessarily present in the polymer (A) in such an amount that the double-bond forms all of water-insoluble materials. This insolubilization is mainly accomplished by the monomer (B) and the photopolymerizable unsaturated compound (C).

The polymer (A) used in the present invention can be prepared by copolymerizing the following components:

(a) 3 to 50 mole %, preferably 10 to 30 mole % of an $\alpha,\beta$-ethylenically unsaturated monomer having an amino group, (b) 5 to 95 mole %, preferably 20 to 60 mole % of a polymerizable unsaturated monomer, and (c) 0 to 90 mole %, preferably 20 to 60 mole % of a conjugated diene monomer.

Preferably, the weight average molecular weight of the polymer (A) is within the range of 5,000 to 500,000, more preferably 10,000 to 250,000.

The $\alpha,\beta$-ethylenically unsaturated monomer (a) having the amino group used in the polymer (A) preferebly has the following formula:

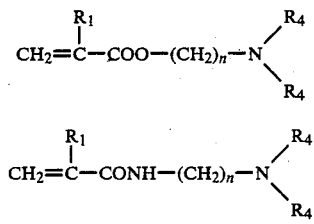

wherein $R_1$ represents a hydrogen atom or a methyl group, $(CH_2)_n$ represents an ethylene, trimethylene, butylene moiety, and $R_4$ represents a hydrogen atom, an alkyl group having 1 to 4 carbon atoms, an hydroxyalkyl group having 1 to 4 carbon atoms, or an alkoxyalkyl having 1 to 4 carbon atoms. Preferred examples are dimethylaminoethyl (meth)acrylate, diethylaminoethyl (meth)acrylate, dimethylaminoethyl (meth)acrylamide, dimethylaminopropyl (meth)acrylamide and the like.

Examples of the polymerizable unsaturated monomers (b) used in the polymer (A) are styrene, $\alpha$-methylstyrene, vinyltoluene, acrylonitrile, vinyl chloride, vinylidene chloride, a (meth)acrylic acid ester, (meth)acryl amide, dicyclopentenyl (meth)acrylate, dicyclopentenoxyethyl (meth)acrylate, dicyclopentenoxypropyl (meth)acrylate, a (meth)acrylic ester of diethylene glycol dicyclopentenyl monoether and a mixture thereof. Examples of the (meth)acrylic esters are methyl (meth)acrylate, ethyl (meth)acrylate, n-butyl (meth)acrylate, 2-ethylhexyl (meth)acrylate and the like.

Examples of the conjugated diene monomers (C) are conjugated diene hydrocarbons such as butadiene, isoprene, dimethylbutadiene, chloroprene and the like.

The monomer (B) having the $\alpha,\beta$-ethylenically unsaturated bond contains a free acid group which can quaternize the polymer (A) to make itself water-soluble and a polymerizable unsaturated bond which can be unsaturated compound (C) to make itself water-insoluble.

Examples of the free acid groups are a carboxylic acid group, a phosphoric acid group, a sulfonic acid group and the like. Preferred monomers have the following formulas:

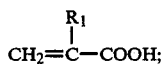

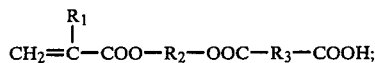

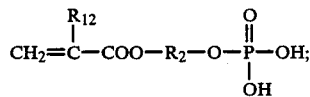

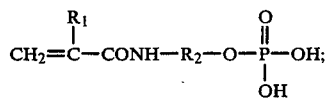

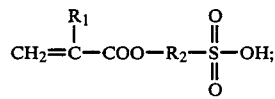

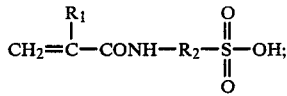

wherein $R_1$ represents a hydrogen atom or a methyl group, $R_2$ represents $(CH_2)_n$ wherein n is an integer of 1 to 6, and $R_3$ represents an alkylene group having 1 to 6 carbon atoms or a phenylene group.

Examples of the $\alpha,\beta$-ethylenically unsaturated monomers (B) containing the carboxylic acid group are (meth)acrylic acid, maleic acid, fumaric acid, citraconic acid and the like. Examples of the monomers (B) containing the sulfonic acid group are 2-acrylamido-2-methylpropanesulfonic acid and the like. Also examples of the monomers (B) containing the phosphoric acid group are 2-hydroxyethyl acryloyl phosphate, 2-hydroxypropyl acryloyl phosphate, 2-hydroxy-$\alpha$-chloropropyl acryloyl phosphate and the like. Above monomers can be used individually or can be mixed up.

The photopolymerizable unsaturated compound (C) of the present invention may be of conventional types which are non-gaseous ethylenically unsaturated compound that preferably contain at least one ethylene group in the terminal and also can be dissolved with the above polymer (A). Examples of the compounds (C) are unsaturated carboxylic esters such as ethylene glycol di(meth)acrylate, diethylene glycol di(meth)acrylate, triethylene glycol di(meth)acrylate, tetraethylene glycol di(meth)acrylate, 1,4-butanediol di(meth)acrylate, 1,6-hexanediol di(meth)acrylate, 1,4-cyclohexanediol di(meth)acrylatel, propylenediol di(meth)acrylate, neopentyl glycol di(meth)acrylate, pentaerythrrtol tetra(meth)acrylate; unsaturated amides such as N,N'-methylene bisacrylamide, N,N'-ethylene bisacrylamide, N,N'-hexamethylenebisacrylamide, N,N'-xylylenebisacrylamide, N-($\beta$-hydroxyethyl)methacrylamide, N,N'-bis($\beta$-hydroxyethyl)acrylamide; urethanized (meth)acrylates derived from 2-hydroxyethyl (meth)acrylate and an isocyanate compound; mono- or di-(meth)acrylates of diepoxy polyethers modified by aromatic polyhydric alcohols such as bisphenol, a noborac compound and the like; a mixture thereof. Preferably the compounds having poor hydrophilic nature are employed.

Examples of the photopolymerization initiators (D) are benzoin ethers such as benzoin methyl ether, benzoin ethyl ether, benzoin isopropyl ether, benzoin butyl ether; benzophenones such as benzophenone, o-benzoylmethyl benzoate and the like; xanthones such as xanthone, thioxanthone, 2-chlorothioxanthone, 2-isopropylthioxanthone and the like; acetophenones such as acetophenone, trichloroacetophenone, 2,2-diethoxyacetophenone, 2,2-dimethoxyacetophenone 2,2-dimethoxy-2-phenyl acetophenone and the like; benzyl-2-ethyl-anthraquinone; methylbenzoyl formate; 2-hydroxy-2-methyl-propiophenone; 2-hydroxy-4-isopropyl-2-methlpropiophenone; 1-hydroxycyclohexyl phenyl ketone; and a mixture thereof.

The photosensitive resin composition of the present invention contains:

(i) 30 to 90%, preferably 40 to 80% by weight of the above polymer (A);

(ii) sufficient amount of $\alpha,\beta$-ethylenically unsaturated monomer (B) having an acid group to quaternize 20 to 250 mole % of the amino group in the polymer (A), generally 1 to 60% by weight;

(iii) 5 to 70%, preferably 10 to 55% by weight of the photopolymerizable unsaturated compound (C); and (iv) 0.01 to 20%, preferably 0.05 to 10% by weight of the photopolymerization initiator (D).

The present composition may optionally contain a polymerization inhibitor such as hydroquinone, p-methoxyphenol, 2,6-di-t-butylcatechol, benzoquinone, naphthoquinone, 2,6-diphenyl-p-benzoquinone, phenothiazine, and the like; a dye such as eosine Y, rose bengal, malachite green, methylene blue and the like; and a plasticizer such as a dialkyl phthalate, a dialkyl fumarate, a dialkyl sebacate, a dialkyl itaconate, an alkyl phosphate, (poly)ethylene glycol, a (poly)ethylene glycol ester, a (poly)ethylene glycol ether.

The photosensitive resin composition of the present invention is molded to an uniform sheet of 0.01 to 10.00 mm by a molding method such as an extrusion molding, a calender molding and the like and the sheet is bonded to a substrate through an adhesive layer. The photosensitive layer is exposed with ultraviolet while the composition is polymerized on the part of the exposure to obtain a polymerized latent image which is insoluble in water, an alkali solution, and an organic solvent. The unexposed part is removed with water to form a relief printing plate which has an excellent resistance to an aqueous ink.

The photosensitive resin composition of the present invention is essentially water-soluble, but the plate obtained from the composition is easily polymerized to make itself water-insoluble. Therefore, an ultraviolet light is exposed through a negative film to the plate and washed with water to obtain the plate for printing having the image faithful to the film. Accordingly, development can be conducted with water, and the plate is water-insoluble so that print can be conducted with a water based ink. The photosensitive resin composition of the present invention is suitable not only for the relief printing plate, but also for an offset printing plate, a screen and a resist.

The present invention are illustrated by the following examples, which are not to be construed as limiting the invention to their details. All parts and percentages in the examples are by weight unless otherwise specified.

EXAMPLE

EXAMPLE 1

The photosensitive resin composition was prepared by mixing the following ingredients;

| Ingredients | Parts by weight |
| --- | --- |
| Copolymer resin[1] | 40 |
| VISCOAT-2,000[2] | 14 |
| Hydroxypropyl acrylate | 17 |
| 1,6-hexandiol diacrylate | 16.6 |
| 2,2-dimethoxy-2-phenyl acetophenone | 2.16 |
| 2,6-di-t-butylcatechol | 0.24 |

[1] The copolymer resin (MW = 100,000) prepared from 15 parts of butadiene, 20 parts of ethyl acrylate, 25 parts of acrylonitrile, and 40 parts of dimethylaminoethyl acrylate.
[2] The half-ester of 2-hydroxyethyl acrylate with phthalic acid, which is commercially available from OSAKA YUKI KAGAKU Co. LTD.

The resultant composition was calender-molded on a steel plate of 0.18 mm in thickness, providing total thickness of about 0.5 mm at about 80° C.

A negative film was contacted to the photosensitive plate under vacuum on the composition side. Then the composition was exposed with a chemical lamp of 350 W at a distance of 6 cm for one minute followed by removing the negative film and washing with a nylon blush in water at 40° C. for 2 minutes to obtain a relief image faithful to the negative film having the Shore A hardness of 95°.

When this was tried in printing over a kraft paper with a Stack type flexographic press by using the water based ink, the sharp image was maintained for more than 2 hours at 50 m/min. In addition, when a 2.5 cm×5.0 cm sample of this plate was dipped for 2 hours at 40° C. in the water solution containing 1 wt % of $Na_2CO_3$ and 5 wt % of butyl cellosolve, the surface of the sample was swelled 6.4% of the thickness of the sample. It showed that the composition has excellent water-resistance.

COMPARATIVE EXAMPLE 1

The photosensitive resin composition wa prepared from the following ingredients;

| Ingredients | Parts by weight |
| --- | --- |
| Water-soluble polyamide resin[3] | 80 |
| Tetraethylene glycol | 10 |
| Acrylamide | 6 |
| N,N'-methylene bisacrylamide | 2 |
| Benzoin isobutyl ether | 2.5 |
| 2,6-di-t-butylcatechol | 0.4 |

-continued

| Ingredients | Parts by weight |
| --- | --- |
| p-methoxphenol | 0.1 |

[3] The water-soluble polyamide resin having hydrogen atoms at α-position of polyε-capramide substituted for dimethylamino group in the amount of 52 mole %

The above ingredients were mixed at room temperature by a press kneader, and then the mixture was extruded to a rod shape with an extruder. The extruded stock was calender-molded on a color galvanized plate of 0.3 mm thickness to obtain a photosensitive composition sheet having the total thickness of 0.96 mm.

The composition sheet was madeup as generally described in Example 1 to obtain a relief image of 0.66 mm thickness faithful to the negative film having Shore A hardness of 96°. When a 2.5 cm×5.0 cm sample of this plate was dipped for 2 hours at 40° C. in the solution containing 1 wt % of $Na_2CO_3$ and 5 wt % of butyl cellosolve, the surface of the sample was swelled more than 20% of the thickness of the sample.

EXAMPLE 2

The photosensitive resin composition was prepared by mixing the following ingredients;

| Ingredients | Parts by weight |
| --- | --- |
| Copolymer resin of Example 1 | 50 |
| 2-hydroxyethyl acryloyl phosphate | 4.8 |
| Phenoxyethyl acrylate | 23.9 |
| 1,6-hexandiol acrylate | 23.9 |
| 2,2-dimethoxy-2-phenyl acetophenone | 2.16 |
| 2,6-di-t-butylcatechol | 0.24 |

The resultant composition was calender-molded on a steel panel of 0.18 mm in thickness, providing total thickness of about 0.5 mm at about 80° C.

The resultant resin composition was exposed as generally described in Example 1 followed by washing with the nylon brush in water at 40° C. for 50 seconds to obtain a releaf image faithful ro the negative film having Shore A hardness of 84°. When a 2.5 cm×5.0 cm sample of this plate was dipped for 2 hours at 40° C. in the water solution containing 1 wt % of $Na_2CO_3$ and 5 wt % of butyl cellosolve, the surface of the sample was swelled 7.9% of the thickness of the sample. In addition when printing was conducted at the speed of 150 m/min on the kraft paper with the press described in Example 1 by using the relief plate obtained in the above method, the sharp image was maintained for more than 2 hours.

EXAMPLE 3

The photosensitive resin composition was prepared by mixing the following ingredients;

| Ingredients | Parts by weight |
| --- | --- |
| Copolymer resin of Example 1 | 50 |
| 2-acrylamide-2-methylpropane-sulfonic acid | 4.8 |
| Urethane compound of 2-hydroxyethyl acrylate and butylisocyanate | 23.9 |
| 1,6-hexandiol acrylate | 23.9 |
| 2,2-dimethoxy-2-phenyl acetophenone | 2.16 |
| 2,6-di-t-butylcatechol | 0.24 |

The resultant composition was calender-molded on a steel panel of 0.18 mm in thickness, providing total thickness of about 1.9 mm at about 80° C.

The resultant resin composition was exposed as generally described in Example 1 followed by washing with the nylon brush in water at 40° C. for 1 minutes to obtain a releaf image faithful to the negative film having the Shore A hardness of 76°. When a 2.5 cm×5.0 cm sample of this plate was dipped for 2 hours at 40° C. in the water solution 1 wt % of $Na_2CO_3$ and 5 wt % of butyl cellosolve, the surface of the sample was swelled 9.6% of the thickness of the sample. In addition when printing was conducted for 1 hour as generally described in Example 2, the sharp image was maintained.

What is claimed is:

1. A photosensitive resin composition for use in the preparation of relief printing plates, said composition consisting essentially of:
(i) a polymer (A) having a molecular weight of 5,000 to 500,000 which contains an amino group and a polymerizable double-bond moiety, said polymer being prepared by copolymerizing (a) 3 to 50 mol percent of an $\alpha,\beta$-ethylenically unsaturated monomer having an amino group, (b) 20 to 60 mol percent of a polymerizable unsaturated monomer selected from the group consisting of styrene, $\alpha$ methyl styrene, vinyl toluene, acrylonitrile, vinyl chloride, vinylidene chloride, (meth) acryl amide, (meth) acrylic acid esters, dicyclopentenyl (meth) acrylate, dicyclopentenoxyethyl (meth) acrylate, dicyclopentenoxypropyl (meth) acrylate, (meth) acrylate esters of diethylene glycol dicyclopentenyl monoether, and mixtures thereof, and (c) 20 to 60 mol percent of a conjugated diene monomer, (ii) a monomer (B) having an $\alpha,\beta$-ethylenically unsaturated bond and a free acid group which can quaternize the nitrogen atom of said polymer (A) and render said polymer water soluble of water dispersable, (iii) a nongaseous ethylenically unsaturated compound (C) having at least one terminal ethylenic double bond capable of being dissolved in said polymer (A) selected from the group consisting of carboxylic acid esters, unsaturated amides, (meth) acrylated urethanes, and mono and di (meth) acrylates of diepoxy polyethers, and (iv) a photopolymerization initiator (D), said composition, upon application to a support and imaging by exposure to ultraviolet light, being developable in the unexposed areas solely with water to form a relief printing plate that is resilient to swelling with water based inks.

2. The composition of claim 1 in which the $\alpha,\beta$-ethylenically unsaturated monomer (a) having the amine group is a (meth)acrylate or (meth)acrylamide having the amino group.

3. The composition of claim 1 in which the polymerizable unsaturated monomer (b) is a (meth)acrylate or a (meth)acrylamide.

4. The composition of claim 1 in which the monomer (B) having a $\alpha,\beta$-ethylenically unsaturated bond is selected from the group consisting of monomers having the following formulas:

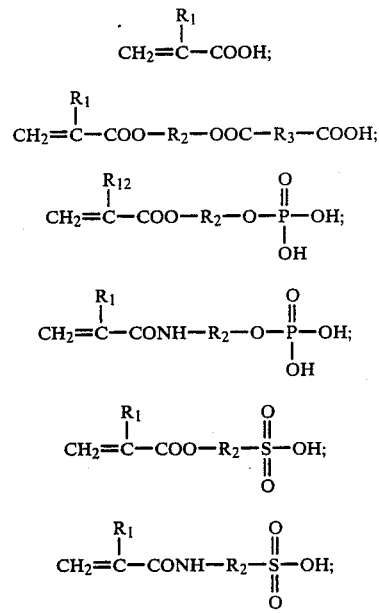

wherein $R_1$ represents a hydrogen atom or a methyl group, $R_2$ represents $(CH_2)_n$ wherein n is an integer of one to 6, and $R_3$ represents an alkylene group having 1 to 6 carbon atoms or a phenylene group.

5. The composition of claim 1 in which the photopolymerization initiator is a benzoin ether, acetophenone, benzophenone, or a ketal derivative.

6. An element for use in the preparation of relief printing plates, comprising a support and a coating thereon of the water developable photosensitive composition of claims 1, 2–4, 5, or 7, said element being developable solely with water and, upon curing, being resistant to swelling when used with water-based inks.

7. The photosensitive composition of claims 1 or 7 in which said $\alpha,\beta$-ethylenically unsaturated monomer (a) is 10 to 30 mol percent and selected from the group consisting of

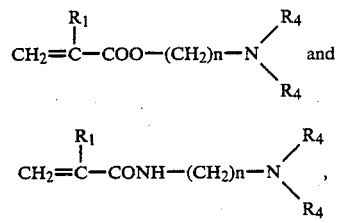

wherein $R_1$ is hydrogen or a methyl group, $(CH_2)_n$ in ethylene, trimethalene or butylene, and $R_4$ is H or alkyl, hydroxyalkyl, or alkoxyalkyl having 1 to 4 carbon atoms.

* * * * *